United States Patent
Konno et al.

(10) Patent No.: US 7,449,722 B2
(45) Date of Patent: *Nov. 11, 2008

(54) SEMICONDUCTOR LIGHT EMITTING ELEMENT

(75) Inventors: Taichiroo Konno, Tsuchiura (JP);
Kazuyuki Iizuka, Tsuchiura (JP);
Masahiro Arai, Ishioka (JP); Takashi Furuya, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 266 days.

This patent is subject to a terminal disclaimer.

(21) Appl. No.: 11/285,388

(22) Filed: Nov. 23, 2005

(65) Prior Publication Data
US 2007/0023768 A1 Feb. 1, 2007

(30) Foreign Application Priority Data
Aug. 1, 2005 (JP) .............................. 2005-223214

(51) Int. Cl.
*H01L 33/00* (2006.01)
(52) U.S. Cl. .......................... 257/94; 257/79; 257/101; 257/103; 257/E33.001
(58) Field of Classification Search ............... 257/79, 257/81, 94, 98, 101, 103
See application file for complete search history.

(56) References Cited

U.S. PATENT DOCUMENTS

| | | | |
|---|---|---|---|
| 5,444,269 A * | 8/1995 | Adomi et al. | 257/94 |
| 5,856,682 A | 1/1999 | Sasaki | |
| 2002/0179923 A1 | 12/2002 | Morita et al. | |
| 2007/0075321 A1 * | 4/2007 | Konno et al. | 257/86 |

FOREIGN PATENT DOCUMENTS

| | | |
|---|---|---|
| CN | 1176500 | 11/2004 |
| JP | 3195194 | 6/2001 |

OTHER PUBLICATIONS

Chinese Office Action dated Jan. 4, 2008, with English translation.

* cited by examiner

*Primary Examiner*—Wai-Sing Louie
(74) *Attorney, Agent, or Firm*—McGinn IP Law Group, PLLC (57) ABSTRACT

A semiconductor light emitting element has a first conductive-type cladding layer, an undoped active layer, a second conductive-type cladding layer, and a second conductive-type current spreading layer that are formed on a first conductive-type semiconductor substrate. The second conductive-type cladding layer has a first dopant suppressing layer formed at a portion in the second conductive-type cladding layer, the portion being not in contact with the active layer. The first dopant suppressing layer has a dopant concentration lower than a region in the vicinity of the first dopant suppressing layer.

24 Claims, 8 Drawing Sheets

SEMICONDUCTOR LIGHT EMITTING ELEMENT

The present application is based on Japanese patent application No. 2005-223214, the entire contents of which are incorporated herein by reference.

BACKGROUND OF THE INVENTION

1. Field of the Invention

The present invention relates to a semiconductor light emitting element and, in particular, to a semiconductor light emitting element with high reliability and high brightness.

2. Description of the Related Art

Conventionally, most of light-emitting diodes (hereinafter referred to as LED) as a semiconductor light emitting element were GaP-based green. LEDs or AlGaAs-based red LEDs. In recent years, however, it becomes possible to grow a GaN-based and an AlGaInP-based high-quality crystal by MOVPE (Metalorganic Vapor Phase Epitaxy). Thus, it becomes possible to fabricate blue, green, orange, yellow, and red LEDs with high brightness.

However, the conventional AlGaInP-based LEDs have a problem in device reliability. Especially, it is an important issue to ensure reliability in relative output (i.e., emission output after a continuous current distribution test, provided that emission output before the test is 100%) and reverse voltage (Vr) of the device.

Japanese Patent No. 3195194 discloses an epitaxial wafer for a semiconductor light emitting element that comprises a first conductive-type cladding layer, an undoped active layer, a second conductive-type cladding layer and a second conductive-type current spreading layer are layered on a first conductive-type semiconductor substrate, wherein an undoped cladding layer is inserted between the second conductive-type cladding layer and the undoped active layer, as a means for increasing relative output of LED.

Figure 1:
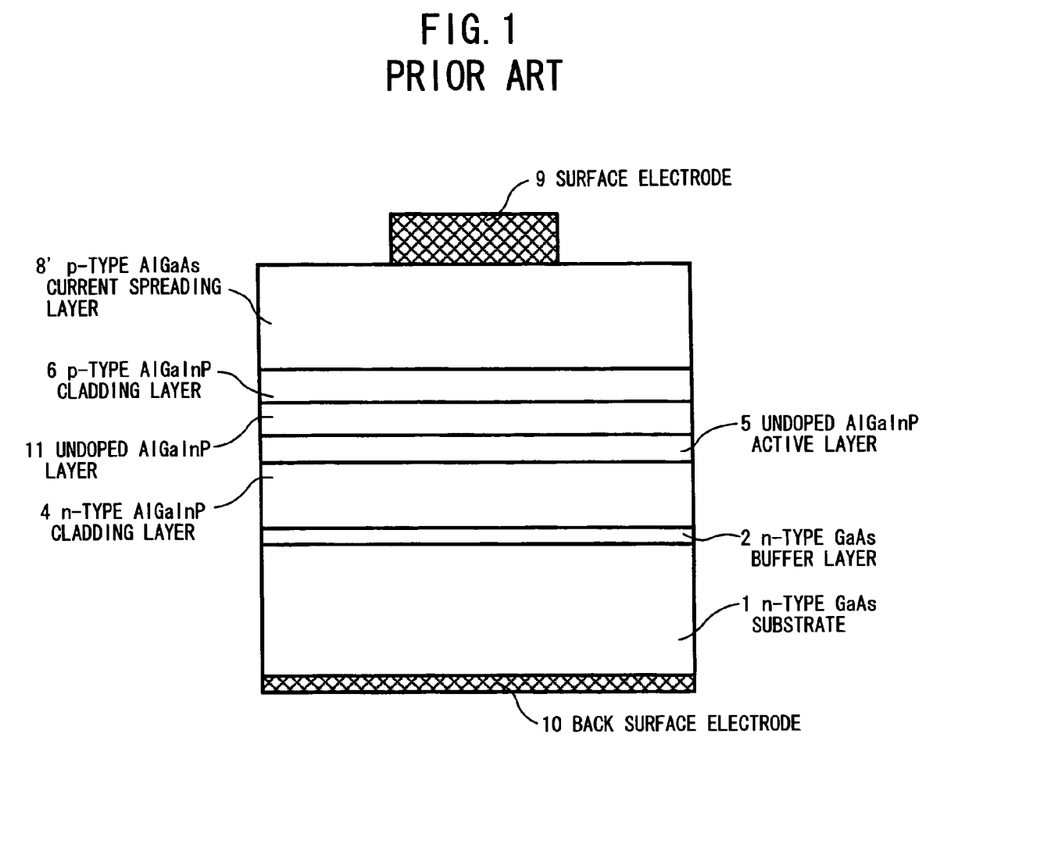
FIG. 1 is a cross-sectional view showing a structure of the epitaxial wafer of the semiconductor light emitting element of the conventional technology.

FIG. 1 is a cross-sectional view showing the semiconductor light emitting element disclosed in Japanese Patent No. 3195194. It is structured such that an n-type GaAs buffer layer 2, an n-type AlGaInP cladding layer 4, an AlGaInP active layer 5, a p-type AlGaInP cladding layer 6 and a p-type AlGaAs current spreading layer 8' are sequentially layered on an n-type GaAs substrate 1, and an undoped AlGaInP layer 11 is formed between the AlGaInP active layer 5 and the p-type AlGaInP cladding layer 6. Further, a surface electrode 9 is formed on the p-type AlGaAs current spreading layer 8', and a back surface electrode 10 is formed on the bottom of the n-type GaAs substrate 1.

From the results of its current distribution test, it is confirmed that relative output of the device can be increased due to insertion of the undoped AlGaInP layer 11 between the AlGaInP active layer 5 and the p-type AlGaInP cladding layer 6.

Although relative output of the light emitting element can be increased when the undoped AlGaInP layer 11 is inserted between the AlGaInP active layer 5 and the p-type AlGaInP cladding layer 6, reduction in reverse voltage (Vr) during the operation cannot be prevented. Namely, the semiconductor light emitting element disclosed in Japanese Patent No. 3195194 is not so reliable in reverse voltage (Vr).

In view of the above-described problem, the applicants uniquely note the diffusion of a dopant (Mg or Zn) from the second conductive-type cladding layer (the p-type AlGaInP cladding layer in Japanese Patent No. 3195194).

In the semiconductor light emitting element disclosed in Japanese Patent No. 3195194, the diffusion of the dopant into the active layer can be prevented to enhance the relative output since the undoped layer is formed between the second conductive-type cladding layer and the active layer. However, in this structure, the diffusion of the dopant into the undoped layer cannot be prevented while the diffusion of the dopant into the active layer can be prevented. Thus, when the dopant in the second conductive-type cladding layer is gradually diffused into the undoped layer, the dopant-diffused region in the undoped layer will be converted into the second conductive type. As a result, distance between the second conductive-type layer and the first conductive-type layer shortens with time. Therefore, the reverse voltage (Vr) lowers with time.

SUMMARY OF THE INVENTION

It is an object of the invention to provide a semiconductor light emitting element with high reliability and high brightness that can prevent reduction in relative output and reverse voltage (Vr) during the operation.

According to one aspect of the invention, a semiconductor light emitting element comprises:

a first conductive-type cladding layer, an undoped active layer, a second conductive-type cladding layer, and a second conductive-type current spreading layer that are formed on a first conductive-type semiconductor substrate, wherein the second conductive-type cladding layer comprises a first dopant suppressing layer formed at a portion in the second conductive-type cladding layer, the portion being not in contact with the active layer, and the first dopant suppressing layer comprises a dopant concentration lower than a region in the vicinity of the first dopant suppressing layer.

In the above invention, the following modifications and changes may be made.

(i) The first dopant suppressing layer is not in contact with a layer formed on the second conductive-type cladding layer.

(ii) The first dopant suppressing layer is formed 200 nm or more distant from the active layer.

(iii) The first dopant suppressing layer is formed at two or more portions in the second conductive-type cladding layer.

(iv) The first dopant suppressing layer is undoped.

(v) The first dopant suppressing layer has a thickness of 50 nm to 300 nm.

(vi) The first dopant suppressing layer comprises a III-V group semiconductor crystal that is in lattice match with the second conductive-type cladding layer except the first dopant suppressing layer.

(vii) The first dopant suppressing layer is transparent to light emitted from a light-emitting layer that comprises the second conductive-type cladding layer, the active layer, and the first conductive-type cladding layer.

(viii) The first dopant suppressing layer is provided with a multilayer structure comprising a plurality of layers.

(ix) The plural first dopant suppressing layers have a thickness of 20 nm to 200 nm.

(x) The plural first dopant suppressing layers each have a thickness of 2 nm to 30 nm.

(xi) The semiconductor light emitting element further comprises an insertion layer formed between the second conductive-type cladding layer and the current spreading layer, wherein the insertion layer has a bandgap energy between the second conductive-type cladding layer and the current spreading layer.

(xii) The insertion layer comprises $Ga_xIn_{1-x}P$, where X satisfies $0.6 \leq X \leq 1$.

(xiii) The semiconductor light emitting element further comprises a light reflecting layer formed between the first conductive-type semiconductor substrate and the first conductive-type cladding layer.

(xiv) The light reflecting layer comprises a combination of $(Al_xGa_{1-x})_YIn_{1-Y}P$, where X and Y satisfy $0 \leq X \leq 1$ and $0.4 \leq Y \leq 0.6$, respectively, and $Al_xGa_{1-x}As$, where X satisfies $0 \leq X \leq 1$.

(xv) The first conductive-type cladding layer comprises a second dopant suppressing layer formed at a portion in the first conductive-type cladding layer, the portion being not in contact with the active layer, and the second dopant suppressing layer comprises a dopant concentration lower than a region in the vicinity of the second dopant suppressing layer.

(xvi) The second dopant suppressing layer is not in contact with a layer formed under the first conductive-type cladding layer.

(xvii) The second dopant suppressing layer is undoped.

(xviii) The second dopant suppressing layer comprises a III-V group semiconductor crystal that is in lattice match with the first conductive-type cladding layer except the second dopant suppressing layer.

(xix) The active layer comprises $(Al_xGa_{1-x})_YIn_{1-Y}P$, where X and Y satisfy $0 \leq X \leq 1$ and $0.4 \leq Y \leq 0.6$, respectively.

(xx) The active layer has a multiple quantum well structure.

(xxi) The second conductive-type cladding layer is doped with Mg or Zn, and the second conductive-type cladding layer and the first conductive-type cladding layer each comprise $(Al_xGa_{1-x})_YIn_{1-Y}P$, where X and Y satisfy $0 \leq X \leq 1$ and $0.4 \leq Y \leq 0.6$, respectively.

(xxii) The semiconductor light emitting element further comprises an n-type semiconductor layer formed on the semiconductor substrate, wherein the n-type semiconductor layer comprises the same material as the semiconductor substrate.

(xxiii) The current spreading layer comprises $Ga_xIn_{1-x}P$, where X satisfies $0.8 \leq X \leq 1$.

As the result of assiduous research, it is found by the inventors that, in a semiconductor light emitting element or an epitaxial wafer for the semiconductor light emitting element using, e.g., Mg or Zn as a second conductive-type dopant, the diffusion of the dopant into the active layer can be prevented by providing an undoped region at a portion inside the second conductive-type cladding layer, the portion being not in contact with the insertion layer and the active layer, to improve the relative output.

Also, it is found by the inventors that the similar effect can be obtained by providing an undoped multilayer-structured layer at a portion in the second conductive-type cladding layer, the portion being not in contact with the insertion layer and the active layer.

Further, it is found by the inventors that reduction in reverse voltage can be prevented by not providing the undoped layer between the second conductive-type cladding layer and the active layer since a distance between the second conductive-type layer and the first conductive-type layer can be kept thereby.

ADVANTAGES OF THE INVENTION

The semiconductor light emitting element of the invention can have enhanced reliability in relative output and reverse voltage (Vr) as well as high brightness.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment (Structure of Epitaxial Wafer for Semiconductor Light Emitting Element)

Figure 2:
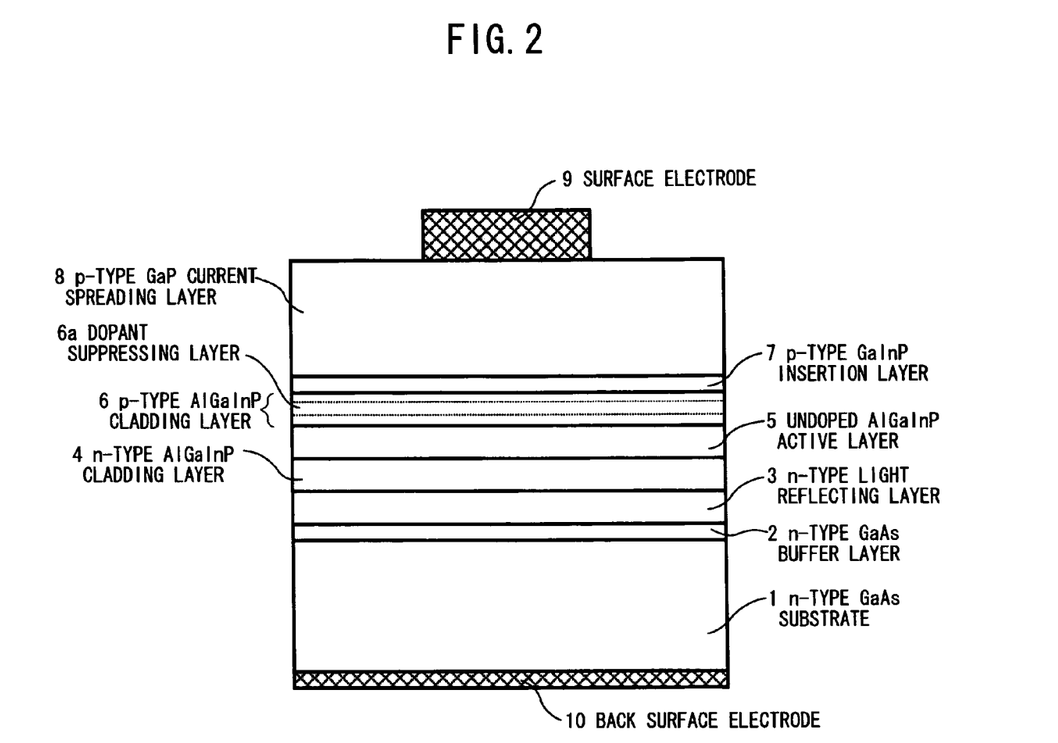
FIG. 2 is a cross-sectional view showing a structure of an epitaxial wafer for a semiconductor light emitting element in a first preferred embodiment according to the invention.

FIG. 2 is a cross-sectional view showing a structure of an epitaxial wafer for a semiconductor light emitting element in the first embodiment of the invention.

An n-type GaAs buffer layer 2, an n-type light reflecting layer 3, an n-type AlGaInP cladding layer 4, an undoped AlGaInP active layer 5, a p-type AlGaInP cladding layer 6, a p-type GaInP insertion layer 7, and a p-type GaP current spreading layer 8 are sequentially formed on an n-type GaAs substrate 1 by an MOVPE process. Furthermore, a surface electrode 9 is formed on the p-type GaP current spreading layer 8, and a back surface electrode 10 is formed on a back surface of the n-type GaAs substrate 1.

The p-type AlGaInP cladding layer 6 has a dopant suppressing layer 6a in which dopant is not doped, on a portion thereof which is not in contact with the undoped AlGaInP active layer 5 and the p-type GaInP insertion layer 7, a dopant-doped layer 6b on a portion thereof which is in contact with the undoped AlGaInP active layer 5, and a dopant-doped layer 6c on a portion thereof which is in contact with the p-type GaInP insertion layer 7.

(Layer Structure of Epitaxial Wafer)

The above-mentioned n-type light reflecting layer 3 is composed of a combination of a $(Al_xGa_{1-x})_YIn_{1-Y}P$ layer (in which X and Y satisfy $0 \leq X \leq 1$ and $0.4 \leq Y \leq 0.6$, respectively) and an $Al_xGa_{1-x}As$ layer (in which X satisfies $0 \leq X \leq 1$).

Each of the above-mentioned cladding layer 4, the active layer 5, and the p-type cladding layer 6 is composed of $(Al_xGa_{1-x})_YIn_{1-Y}P$ (in which X and Y satisfy $0 \leq X \leq 1$ and $0.4 \leq Y \leq 0.6$, respectively).

The above-mentioned current spreading layer 8 is composed of $Ga_xIn_{1-x}P$ (in which X satisfies $0.8 \leq X \leq 1$).

The p-type insertion layer 7 interposed between the p-type cladding layer 6 and the p-type current spreading layer 8 is composed of $Ga_XIn_{1-X}P$ (in which X satisfies $0.6 \leq X \leq 1$).

And, the p-type insertion layer 7 preferably has band gap energy between the p-type cladding layer 6 and the p-type current spreading layer 8. Thereby, it becomes possible to lower a forward voltage (Vf) of an LED.

The above-mentioned p-type current spreading layer 8 may be directly formed on the above-mentioned p-type cladding layer 6, without providing the p-type insertion layer 7, but in this case, a restrictive effect of the forward voltage (Vf) of the LED is deteriorated.

Doping amount or a carrier concentration of p-type dopant preferably increases in order of the p-type cladding layer 6, the p-type current spreading layer 8, the p-type insertion layer 7 (doping amount of dopant in the p-type cladding layer 6<doping amount of dopant in the p-type current spreading layer 8<doping amount of dopant in the p-type insertion layer 7).

[Structure of Dopant Suppressing Layer]

Figure 3:
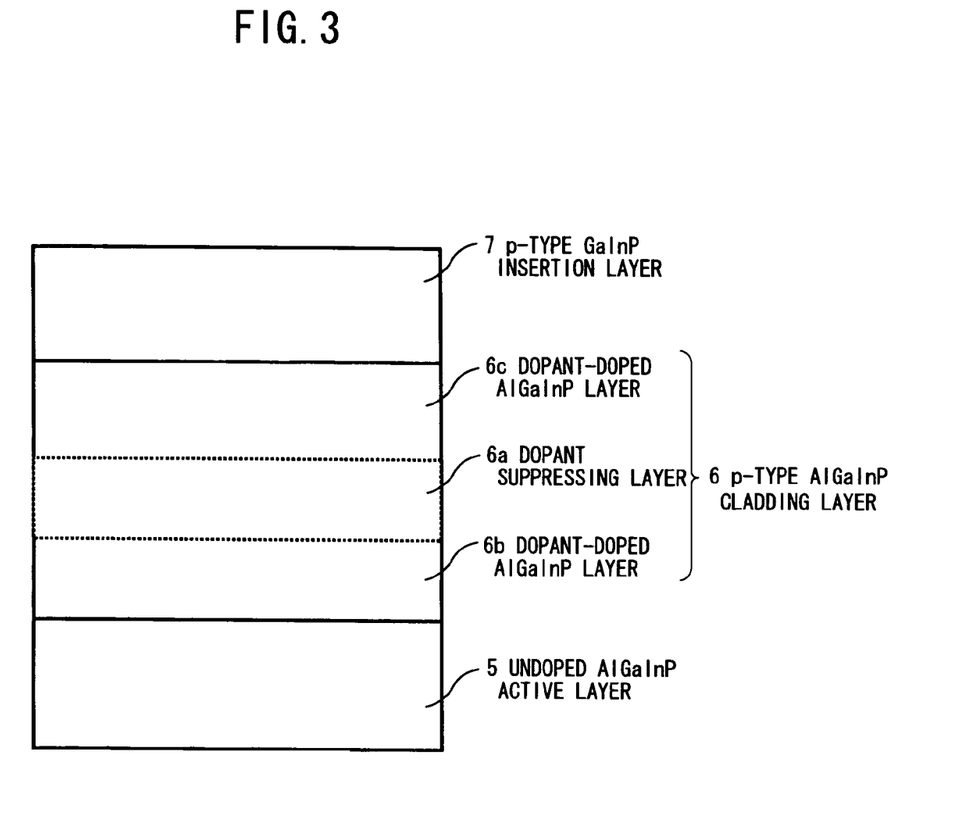
FIG. 3 is an enlarged cross-sectional view showing a layered structure of an active layer, a p-type cladding layer and a p-type insertion layer, of the epitaxial wafer of the first embodiment as shown in FIG. 2.
Figure 4:
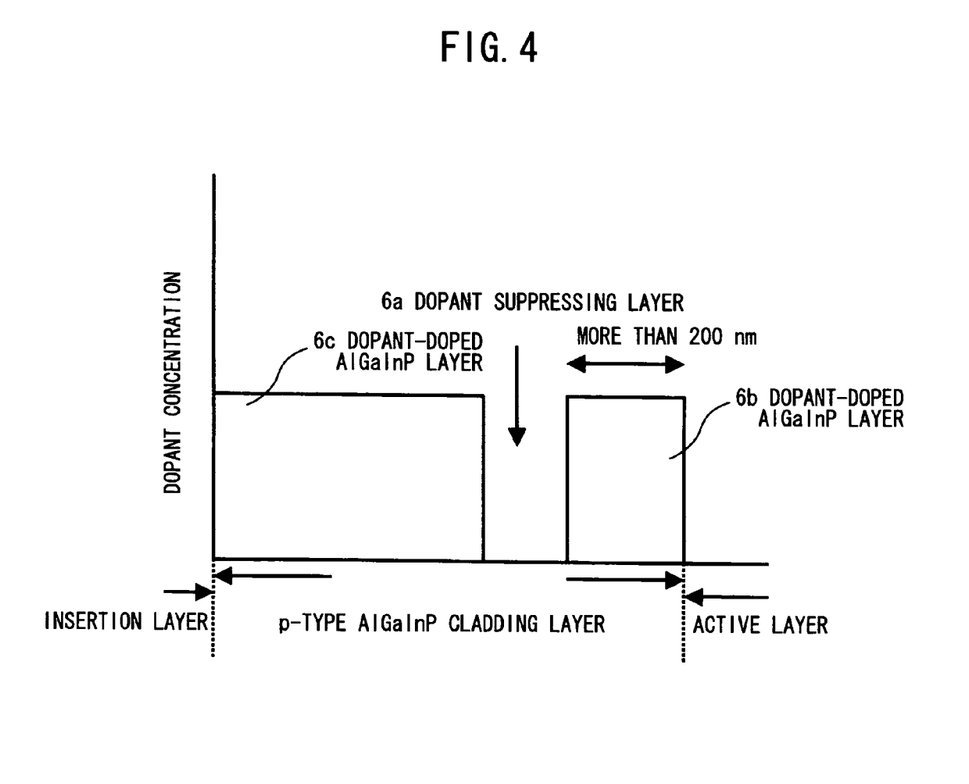
FIG. 4 is a schematic view showing a relationship between the p-type cladding layer as shown in FIG. 3 and a dopant suppressing amount.

FIG. 3 is an enlarged cross-sectional view showing a layer structure of the active layer 5, the p-type cladding layer 6 and the p-type insertion layer 7 of the epitaxial wafer in the first embodiment as shown in FIG. 2. FIG. 4 is a schematic view showing a relationship between each section of the p-type cladding layer 6 shown in FIG. 3, and amount of dopant suppression. Dopant is not doped in the dopant suppressing layer 6a.

Meanwhile, an expression "undoped" used in the present invention are intended to mean that positive or intentional doping is not performed, and are not intended to eliminate impurities naturally or inevitably mixed in a crystal. Therefore, a condition in which inevitable impurities are mixed should be included in an "undoped" category.

As shown in FIG. 3, the above-mentioned dopant suppressing layer 6a is formed on a position 200 nm from the above-mentioned active layer 5, in a film thickness of 300 nm.

The reason for providing the dopant suppressing layer 6a in a second conductive-type cladding layer 6 on a portion neither in contact with the p-type insertion layer 7 nor with the active layer 5 as shown in FIGS. 3 and 4, is as follows.

If the dopant suppressing layer 6a contacts the insertion layer 7, since a difference between a dopant concentration of the insertion layer 7 and that of the p-type cladding layer 6 is large, the dopant in the insertion layer 7 easily diffuses, thereby increasing the forward voltage. And, if the dopant suppressing layer 6a contacts the active layer 5, reliability of a reverse voltage (Vr) lowers. Therefore, the dopant suppressing layer 6a is preferably provided in a region, which is a part of the p-type cladding layer 6 and is not in directly contact with the insertion layer 7 and the active layer 5.

The reason for providing the dopant suppressing layer 6a on a position 200 nm from the active layer 5, is to increase an effect of confining a carrier injected from a first conductive-type, thereby increasing a emission output, and to inhibit deterioration of the emission output due to lack of carrier.

In view of preventing an overflow of carrier on an n-side, the carrier concentration of a portion in contact with the active layer 5 is preferably high, and a film thickness (distance from the active layer 5) of this portion is preferably thick. The distance between the dopant suppressing layer 6a and the active layer 5 is preferably not less than 200 nm, but if the distance is more than 400 nm, the dopant diffuses in the active layer 5. On the contrary, if the distance is less than 200 nm, the carrier is not sufficiently supplied, thereby deteriorating the emission output. Therefore, the distance between the dopant suppression layer 6a and the active layer 5 is more preferably 200 nm to 400 nm. In this embodiment, the distance between the dopant suppressing layer 6a and the active layer 5 was set 200 nm to maintain the carrier confining effect of the p-type cladding layer 6.

As for the film thickness of the dopant suppressing layer 6a, if the film thickness is too thick, a series resistance component increases, thereby increasing the forward voltage. On the other hand, if the film thickness is too thin, the effect of inhibiting the dopant diffusion lowers. Therefore, the film thickness is preferably 30 nm to 500 nm, and more preferably, 50 nm to 300 nm.

[Effect of Epitaxial Wafer for Semiconductor Light Emitting Element According to the First Embodiment]

According to the epitaxial wafer for a semiconductor light emitting element of this embodiment, it becomes possible to effectively inhibit the dopant diffusion from the second conductive-type cladding layer side of an LED device, thereby inhibiting deterioration of a relative output (emission output) and of the reverse voltage (Vr) by providing the dopant suppressing layer in the second conductive cladding layer.

Second Embodiment (Structure of Epitaxial Wafer for Semiconductor Light Emitting Element)

Figure 5:
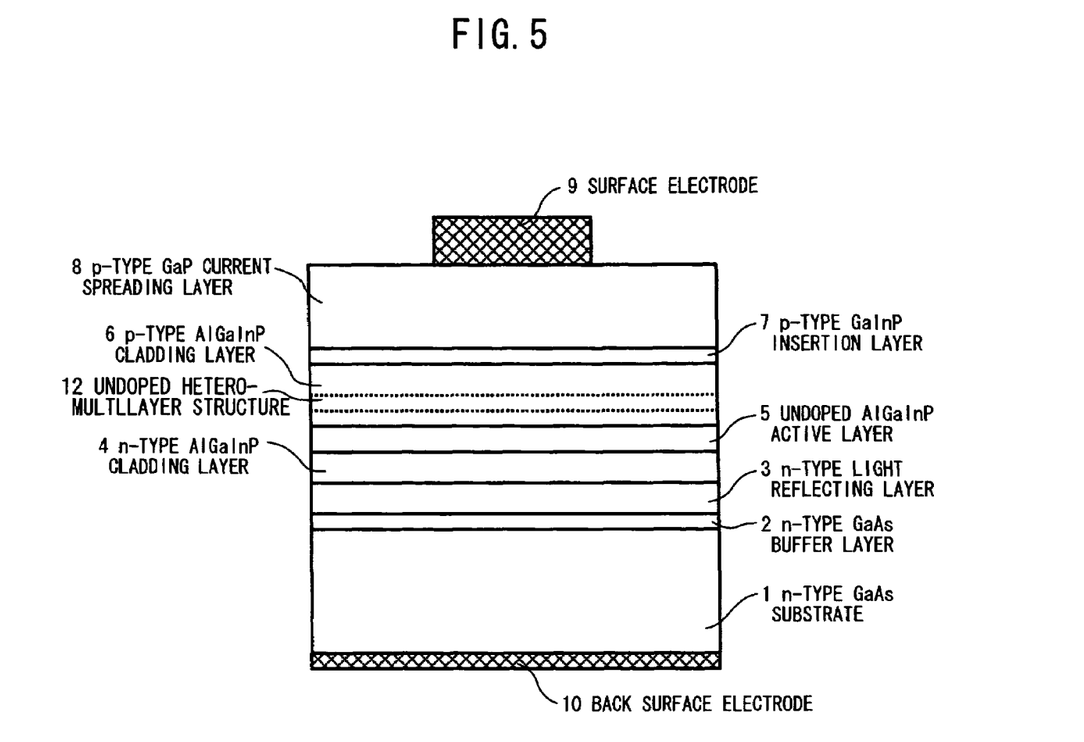
FIG. 5 is a cross-sectional view showing a structure of an epitaxial wafer for a semiconductor light emitting element in a second preferred embodiment according to the invention.
Figure 6:
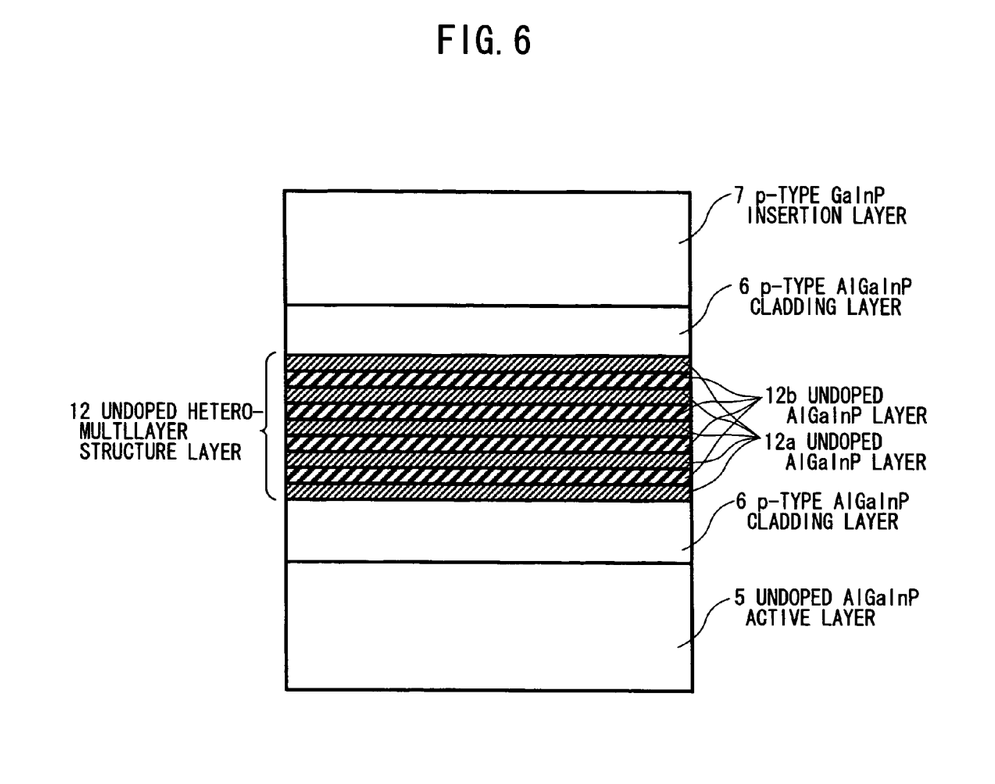
FIG. 6 is an enlarged cross-sectional view showing a layered structure of the active layer 5, the p-type cladding layer 6, and the p-type insertion layer 7, as shown in FIG. 5.

FIG. 5 is a cross-sectional view showing a structure of an epitaxial wafer for a semiconductor light emitting element in the second embodiment of the invention. FIG. 6 is an enlarged cross-sectional view showing a layer structure of the active layer 5, the p-type cladding layer 6, and the p-type insertion layer 7, each as shown in FIG. 5.

In this embodiment, a dopant suppressing portion in the second conductive cladding layer 6 is formed of an undoped hetero-multilayer structure layer 12 composed of a III-V group semiconductor formed of crystal which lattice matches with the p-type cladding layer 6.

The undoped hetero-multilayer structure layer 12 is composed of an undoped $(Al_XGa_{1-X})_YIn_{1-Y}P$ (in which X and Y satisfy $0 \leq X \leq 1$ and $0.4 \leq Y \leq 0.6$, respectively) layer 12a and an undoped $(Al_XGa_{1-X})_YIn_{1-Y}P$ (in which X and Y satisfy $0 \leq X \leq 1$ and $0.4 \leq Y \leq 0.6$, respectively) layer 12b.

As described with regard to the dopant suppressing layer 6a in the first embodiment, the undoped hetero-multilayer structure layer 12 is preferably provided in a region of the p-type cladding layer 6 which is not in direct contact with the insertion layer 7 and the active layer 5.

The undoped hetero-multilayer structure layer 12 is preferably composed of transparent material to light (emission wavelength) emitted at the active layer 5, and, the larger band gap difference is, the better the dopant diffusion is inhibited. That is to say, the undoped hetero-multilayer structure layer 12 is preferably composed of a combination of material being transparent relative to the emitted light and having a large band gap difference.

While the film thickness of the undoped hetero-multilayer structure layer 12 is substantially the same as that of the dopant suppressing layer 6a, this may be made thinner than that of the dopant suppressing layer 6a, due to a large dopant diffusion inhibiting effect in a hetero portion thereof. On the other hand, it is difficult to make the film thickness of the layer 12 thicker than that of the dopant suppressing layer 6a due to large resistance owing to a hetero barrier. Therefore, the film thickness of an entire undoped hetero-multilayer structure layer 12 is preferably 20 to 400 nm, and more preferably, 20 nm to 200 nm.

As for each film thickness (film thickness of one layer) of the undoped layers 12a and 12b of the undoped hetero-multilayer structure layer 12, if the film thickness is too thin, an effect of multilayer structure, that is, the dopant diffusion inhibiting effect, is deteriorated. On the other hand, if the film thickness is too thick, this prevents progress of the carrier from the p-type cladding layer 6 which is in contact with an insertion layer 7 side, thereby deteriorating the emission output due to lack of the carrier, and increasing the forward voltage. Therefore, each film thickness of layers 12a and 12b of the undoped hetero-multilayer structure layer 12 is preferably 2 nm to 30 nm. And, even if an upper limit of the film thickness of each of the layers is set 40 nm, this can be used as the LED, although the forward voltage somewhat increases, the film thickness may be 2 nm to 40 nm.

[Effect of Epitaxial Wafer for Semiconductor Light Emitting Element According to the Second Embodiment]

According to the epitaxial wafer for a semiconductor light emitting element of this embodiment, it becomes possible to effectively inhibit the dopant diffusion from the second conductive-type cladding layer side of the LED device, and to inhibit deterioration of the relative output (emission output) and of the reverse voltage (Vr) by interposing the undoped hetero-multilayer structure layer.

(Characteristic Measurement Result of LED Device According to Examples and Comparative Examples)

Following examples 1 and 2, and comparative examples 1 and 2 were produced by way of trail to verify the effect of the present invention.

EXAMPLE 1

Example 1: Epitaxial Wafer Having Second Conductive-Type Cladding Layer, a Portion of which is Dopant Suppressing Layer An epitaxial wafer for a red LED with an emission wavelength of approximately 630 nm in a structure as shown in FIG. 2, was produced.

(Layer Structure of Epitaxial Wafer)

The Si doped n-type GaAs buffer layer 2 (film thickness: 200 nm, carrier concentration: $1 \times 10^{18}/cm^3$), the n-type light reflecting layer 3 (film thickness: emission peak wavelength ($\lambda$) 4n (n: refractive index), carrier concentration: approximately $1 \times 10^{18}/cm^3$) composed of 20 pairs of light reflecting layers in which 20 AlInP layers and 20 $Al_{0.5}Ga_{0.5}As$ layers were alternatively provided, the Si doped n-type $(Al_{0.7}Ga_{0.3})_{0.5}In_{0.5}P$ cladding layer 4 (film thickness: 400 nm, carrier concentration: $4 \times 10^{17}/cm^3$), the undoped $(Al_{0.1}Ga_{0.9})_{0.5}In_{0.5}P$ active layer 5 (film thickness: 600 nm), an Mg doped p-type $(Al_{0.7}Ga_{0.3})_{0.5}In_{0.5}P$ cladding layer 6 (film thickness: 600 nm, carrier concentration: $2 \times 10^{17}/cm^3$), the Mg doped p-type $Ga_{0.7}In_{0.3}P$ insertion layer 7 (film thickness: 30 nm, carrier concentration $6 \times 10^{18}/cm^3$), and the Mg doped p-type GaP current spreading layer 8 (film thickness: 10,000 nm, carrier concentration: $4 \times 10^{18}/cm^3$) were sequentially layered on the n-type GaAs substrate 1 by the MOVPE process. Furthermore, the dopant was not doped in a region of the $(Al_{0.7}Ga_{0.3})_{0.5}In_{0.5}P$ cladding layer 6, thereby forming the dopant suppressing layer 6a.

(Method of Fabricating Semiconductor Light Emitting Element)

A growth temperature of p-type MOVPE growth is set to 650° C. from the n-type GaAs buffer layer 2 to the p-type insertion layer 7, and is set to 675° C. at the p-type current spreading layer 8. Other growth conditions are determined such that a growth pressure is set to 50 Torr, a growth speed of each layer is set 0.3 to 1.5 nm sec, and a V/III ratio is set approximately 150. But the V/III ratio of the p-type current spreading layer 8 is set 25. Herein, the V/III ratio is a ratio (quotient) in which a denominator is set to a mole number of III-group material, such as Ga and TMAl, and a molecule is set to a mole number of V-group material, such as $AsH_3$ and $PH_3$.

Organic metal such as trimethylgallium (TMGa), triethylgallium (TEGa), trimethylaluminum (TMAl), and trimethylindium (TMIn), and hydrogenated gas such as arsine ($AsH_3$) and phosphine ($PH_3$) are used as material for MOVPE growth.

Disilane ($Si_2H_6$) is used as dopant material for determining a conductivity type of an n-type layer such as the n-type buffer layer 2. And, hydrogen selenide ($H_2Se$), monosilane ($SiH_4$), diethyl telluride (DETe), and dimethyl telluride (DMTe) may also be used as n-type dopant material.

Bis-cyclopentadienyl magnesium ($CP_2Mg$) was used as the dopant material for determining the conductivity type of a p-type layer such as the p-type cladding layer 6. Dimethylzinc (DMZn) and diethylzinc (DEZn) may also be used as the p-type dopant material.

After carrying out the epitaxial wafer thus layered from an MOCVD device, a circular surface electrode 9 with a diameter of 110 μm is formed in a matrix fashion on a surface (upper surface) of the epitaxial wafer. The surface electrode 9 is formed by vapor depositing in the order of 400 nm of AuBe (gold-beryllium alloy), 10 nm of Ni (nickel) and 500 nm of Au (gold). A vapor deposition is performed by a vacuum vapor deposition method by using a device and process used in a general photolithography process, such as a resist and a mask aligner. After the vapor deposition, the electrode is formed by a lift-off process.

Furthermore, a back surface electrode 10 is formed on an entire bottom surface of the epitaxial wafer by the vacuum vapor deposition method as in the case with the surface electrode 9. The back surface electrode 10 is formed by vapor depositing in the order of 60 nm of AuGe (gold-germanium alloy), 10 nm of Ni (nickel) and 500 nm of Au (gold).

Then, the epitaxial wafer is heated up to 400° C. in a nitrogen gas atmosphere, and is heat-treated for 5 minutes, thereby performing alloying (alloying process) of the electrode.

The epitaxial wafer with electrodes for the LED thus fabricated is cut by using a dicing device such that the circular surface electrode 9 becomes the center thereof, thereby fabricating an LED bare chip of 300 μm×300 μm in size.

Furthermore, the LED bare chip was mounted (die bonding) on a TO-18 stem, and wire bonding was performed to a mounted LED bare chip, thereby fabricating an LED device.

Two kinds of examples 1, one in which the film thickness of the dopant suppressing layer 6a is set 100 nm (example 1-1) and the other in which the film thickness thereof is set 300 nm (example 1-2), were produced.

EXAMPLE 2

Example 2: Epitaxial Wafer in which Undoped Hetero-Multilayer Structure Layer is Formed in P-Type Cladding Layer An epitaxial wafer for a red LED with an emission wavelength of approximately 630 nm in a structure as shown in FIGS. 5 and 6, was fabricated as example 2.

In example 2, the dopant suppressing portion in the second conductive-type cladding layer 6 is formed of the hetero-multilayer structure layer 12 composed of the undoped $(Al_{0.7}Ga_{0.3})_{0.5}In_{0.5}P$ layer 12a (film thickness: 10 nm) and the undoped $(Al_{0.5}Ga_{0.5})_{0.5}In_{0.5}P$ layer 12b (film thickness: 10 nm). The undoped layers 12a and 12b having different composition are made to be a pair, and the hetero-multilayer structure layer 12 is formed of six undoped $(Al_{0.7}Ga_{0.3})_{0.5}In_{0.5}P$ layer 12a and five undoped $(Al_{0.5}Ga_{0.5})_{0.5}In_{0.5}P$ layer 12b, in the order of the layer 12a and the layer 12b from the active layer 5 side, and is formed of 5.5 layers.

Figure 7:
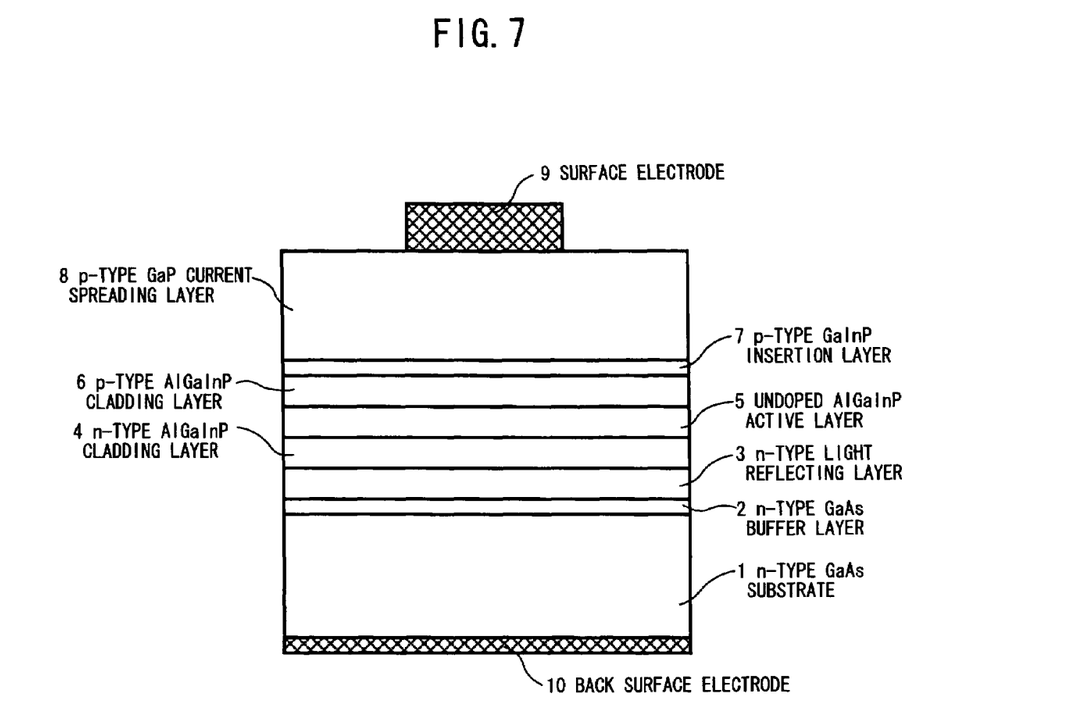
FIG. 7 is a cross-sectional view showing a structure of an epitaxial wafer of a semiconductor light emitting element of comparative example 1.

Comparative Example 1: Epitaxial Wafer in which Undoped Layer is not Provided Between P-Type Cladding Layer and Active Layer An epitaxial wafer for a red LED with an emission wavelength of approximately 630 nm in a structure as shown in FIG. 7, was fabricated as comparative example 1. A layer structure of the epitaxial wafer is as follows. The method of epitaxial growth and the methods for fabricating the electrode and fabricating the LED device are the same as those of example 1.

The Si doped n-type GaAs buffer layer 2 (film thickness: 200 nm, carrier concentration: $1 \times 10^{18}/cm^3$), the n-type light reflecting layer 3 (film thickness: emission peak wavelength ($\lambda$) 4n (n: refractive index), carrier concentration: approximately $1 \times 10^{18}/cm^3$) composed of 20 pairs of the light reflecting layers in which 20 AlInP layers and 20 $Al_{0.5}Ga_{0.5}As$ layers were alternatively provided, the Si-doped n-type $(Al_{0.7}Ga_{0.3})_{0.5}In_{0.5}P$ cladding layer 4 (film thickness: 400 nm, carrier concentration: $4 \times 10^{17}/cm^3$), the undoped $(Al_{0.1}Ga_{0.9})0.5In_{0.5}P$ active layer 5 (film thickness: 600 nm), the Mg doped p-type $(Al_{0.7}Ga_{0.3})_{0.5}In_{0.5}P$ cladding layer 6 (film thickness: 600 nm, carrier concentration: $2 \times 10^{17}/cm^3$), the Mg doped p-type $Ga_{0.7}In_{0.3}P$ insertion layer 7 (film thickness: 30 nm, carrier concentration $6 \times 10^{18}/cm^3$), and the Mg doped p-type GaP current spreading layer 8 (film thickness: 10,000 nm, carrier concentration: $4 \times 10^{18}/cm^3$) were sequentially layered on the n-type GaAs substrate 1 by the MOVPE process.

Figure 8:
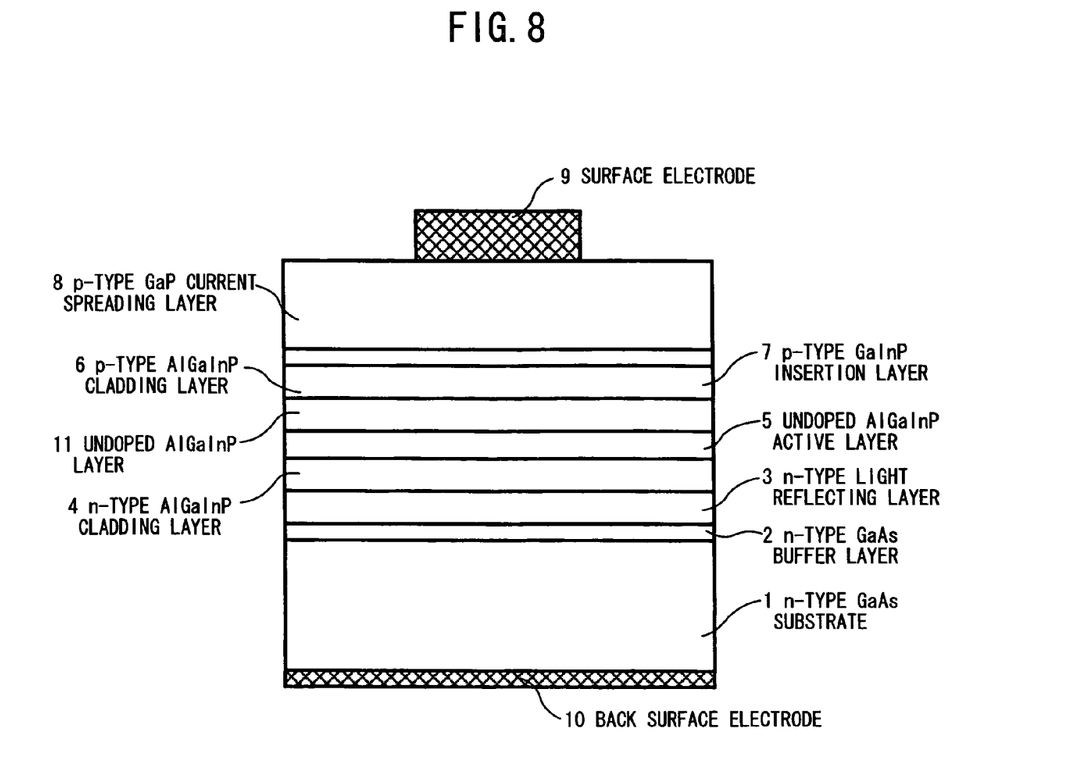
FIG. 8 is a cross-sectional view showing a structure of an epitaxial wafer of a semiconductor light emitting element of comparative example 2.

Comparative Example 2: Epitaxial Wafer Provided with Undoped Layer Between P-Type Cladding Layer and Active Layer An epitaxial wafer for a red LED with an emission wavelength of approximately 630 nm in a structure as shown in FIG. 8, was fabricated as comparative example 2. The method of epitaxial growth and the methods for forming the electrode and fabricating the LED device are same as those of comparative example 1.

Although the layer structure of the epitaxial wafer was substantially the same as that of comparative example 1, comparative example 2 was provided with an undoped $(Al_{0.7}Ga_{0.3})_{0.5}In_{0.5}P$ layer 11 between the undoped $(Al_{0.1}Ga_{0.9})_{0.5}In_{0.5}P$ active layer 5 (film thickness: 600 nm) and the p-type (Mg doped) $(Al_{0.7}Ga_{0.3})_{0.5}In_{0.5}P$ cladding layer 6 (film thickness: 400 nm, carrier concentration: $2 \times 10^{17}/cm^3$).

And, two kinds of examples 2, one in which the film thickness of the undoped $(Al_{0.7}Ga_{0.3})_{0.5}In_{0.5}P$ layer 11 was set 100 nm (comparative example 2-1) and the other in which the film thickness was set 300 nm (comparative example 2-2), were produced. For the rest, comparative example 2 is the same as the above-described comparative example 1.

Table 1 shows emission characteristics and reverse voltage characteristics of the LED device fabricated in comparative examples 1 and 2, and examples 1 and 2.

TABLE 1

Emission characteristics and reverse voltage characteristics of LED

| | Initial characteristics of LED (when applying current of 20 mA) | | Characteristics after continuous current distribution test (see note 1) | |
|---|---|---|---|---|
| | Emission output (mW) | Reverse voltage (V) | Relative output (%) (see note 2) | Reverse voltage (V) |
| Example 1-1 (film thickness: 100 nm) | 1.98 | −58 | 102 | −53 |
| Example 1-2 (film thickness: 300 nm) | 1.95 | −58 | 102 | −55 |
| Example 2 | 2.05 | −61 | 102 | −60 |
| Comparative example 1 | 1.50 | −48 | 68 | −32 |
| Comparative example 2-1 (film thickness of p layer 11: 100 nm) | 1.75 | −58 | 93 | −41 |
| Comparative example 2-1 (film thickness of p layer 11: 300 nm) | 1.70 | −65 | 98 | −52 | note 1) The continuous current distribution test was performed by operating the LED element for 168 hours (=1 week) at 50 mA, under normal temperature and humidity.
note 2) The relative output indicates the emission output after performing the continuous current distribution test, relative to the emission output before the test.

(Measurement Result of Example 1)

Evaluating an initial characteristic of the LED device of the examples 1-1 and 1-2, the emission output when electrifying at 20 mA (at the moment of evaluation) was 1.98 mW (in the case of 100 nm) and 1.95 mW (in the case of 300 nm), and the reverse voltage (Vr) of each was −58V. Therefore, the LED device having an excellent initial characteristic in relation to the emission output and to the reverse voltage (Vr) was obtained.

Next, the LED device was driven under environment of general temperature and humidity at 50 mA to perform the continuous current distribution test for 168 hours (1 week), the relative outputs of each was favorably 102%. The reverse voltage (Vr) was −53V and −55V, respectively.

When an SIMS analysis was performed to the LED device just after fabricating the same, and after performing the continuous current distribution test to the same, it was confirmed that Mg, being the p-type dopant, getting mixed in the active layer even after the continuous current distribution test, and that Mg was hardly diffused.

Therefore, in the LED device in the example 1, it was confirmed that deterioration of the relative output and the reverse voltage (Vr) and deterioration of the emission output due to the dopant diffusion of the LED device can be inhibited by making a portion of the second conductive-type cladding layer the dopant suppressing layer.

(Measurement Result of the Example 2)

Evaluating the initial characteristic of the LED device of the example 2, the emission output when electrifying at 20 mA (at the moment of evaluation) was 2.05 mW, and the reverse voltage (Vr) was −58V. Therefore, the LED device having an excellent initial characteristic in relation to the emission output and to the reverse voltage (Vr) was obtained.

Next, when the continuous current distribution test as in the embodiment 1 was performed, the relative output was very favorably 102%. And the reverse voltage (Vr) was very favorably −60V.

When the SIMS analysis was performed to the LED device just after fabricating the same, and after performing the continuous current distribution test to the same, it was confirmed that Mg, being p-type dopant, getting mixed in the active layer after performing the continuous current distribution test, and that Mg was hardly diffused.

Therefore, in the LED device in the example 2, it was confirmed that deterioration of the relative output and the reverse voltage (Vr) and deterioration of the emission output by the dopant diffusion of the LED device can be inhibited by providing the undoped hetero-multilayer structure layer in a portion of the second conductive-type cladding layer.

(Measurement Result of the Comparative Example 1)

Evaluating the initial characteristic of the LED device of the comparative example 1, the emission output when electrifying at 20 mA (at the moment of evaluation) was 1.50 mW, and the reverse voltage (Vr) was −48V.

Next, when the continuous current distribution test as in the example 1 was performed, the relative outputs was 68%, and the reverse voltage (Vr) was −32V, and it was confirmed that they were extremely deteriorated as compared to those of the examples 1 and 2.

And, when the SIMS analysis was performed to the LED device just after producing the same, and after performing the continuous current distribution test to the same, it was confirmed that Mg, being p-type dopant, diffused and mixed in the active layer even after performing the continuous current distribution test. And, when the dopant was changed to Zn, it was confirmed that diffusion level thereof was higher than that of Mg, so that the emission output and the relative output of the LED device was further deteriorated.

(Measurement Result of the Comparative Example 2)

Evaluating the initial characteristic of the LED device of the examples 2-1 and 2-2, the emission output when electrifying at 20 mA (at the moment of evaluation) was 1.75 mW (in the case of 100 nm) and 1.70 mW (in the case of 300 nm), and the reverse voltage (Vr) was −58V and −65V, respectively.

Next, when the same continuous current distribution test as in the example 1 was performed, the relative output was 93% and 98%, and it was confirmed that the relative output was relatively preferable. On the other hand, the reverse voltage (Vr) was −41V and −52V, respectively, and was confirmed to be lower than that of the examples 1 and 2. Therefore, it was proved that the deterioration of the reverse voltage cannot be inhibited while the deterioration of the relative output can be inhibited.

And, when the SIMS analysis was performed to the LED device just after fabricating the same, and after performing the continuous current distribution test to the same, it was confirmed that Mg, being p-type dopant, diffused and got mixed in the active layer even after the continuous current distribution test.

While the semiconductor light emitting element according to the present invention has been described hereinabove on the basis of the above-described embodiments, the present invention is not limited to the above-described embodiments, and may be applicable to various aspects without departing from the scope of the invention. For example, an alternative example as follows is also possible.

(Alternative Example)

In the embodiments of the present invention, the red LED device with the emission wavelength of 630 nm was fabricated as an example. However, even when the other LED device is fabricated by using the same AlGaInP-based material, for example, when an LED device with an emission wavelength of 560 nm to 660 nm is fabricated, the material and the carrier concentration of each layer (especially, the current spreading layer) may be the same as that of the red LED. That is to say, the same effect can be obtained even when the emission wavelength of the LED device is set to be in the range of wavelengths different from that of the embodiment of the present invention.

The first conductive-type buffer layer was provided on the GaAs substrate, and the light reflecting layer was provided on the buffer layer in the embodiment of the present invention. However, it is possible that the first conductive-type cladding layer is directly layered on the GaAs substrate, without providing the first conductive-type buffer layer. And the light reflecting layer may be omitted.

Although GaAs was used as the semiconductor substrate in the embodiment of the present invention, the epitaxial wafer for an LED using Ge as a starting substrate may be used. It is also possible to use GaAs or Ge as the starting substrate, and, remove this later, thereby using the epitaxial wafer for an LED using Si or a metal substrate having higher thermal conductivity than that of Si as an alternative independent substrate.

In the embodiment of the present invention, it is structured that the dopant-undoped layer is provided in the second conductive-type cladding layer as the dopant suppressing layer, or the undoped hetero-multilayer structure layer is inserted in the second conductive-type cladding layer. However, since the dopant is diffused in either of the first and second conductive-type layers, the effect intended by the present invention can be obtained by a structure in which the dopant-undoped layer or the undoped hetero-multilayer structure layer is provided in the first and second conductive-type cladding layers as the dopant suppressing layer, or a structure in which the dopant-undoped layer or the undoped hetero-multilayer structure layer is provided only in the first conductive-type cladding layer as the dopant suppressing layer.

And, the effect intended by the present invention may be obtained by a structure in which the layer, dopant concentration of which is lower than that of a portion in the vicinity thereof, or the hetero-multilayer structure layer, dopant concentration of which is lower than that of a portion in the vicinity thereof, is provided instead of a structure in which the dopant-undoped layer or the undoped hetero-multilayer structure layer is provided. In this case, the dopant diffusion inhibiting effect is deteriorated with compared to the structure provided with the dopant-undoped layer or the undoped hetero-multilayer structure layer, because the dopant is doped. However, by making the film thickness of a low dopant concentration layer thick, the effect as the dopant diffusion suppressing layer can be obtained. And, even if the film thickness is made thick, increase of the forward voltage can be inhibited due to the low dopant concentration. Therefore, in a case in which the low dopant concentration layer or the low dopant concentration hetero-multilayer structure layer is provided, it is preferable that the film thickness is made thicker than that of the dopant-undoped layer or of the undoped hetero-multilayer structure layer.

Although AlGaInP is used as material of the second conductive-type cladding layer and the hetero-multilayer structure layer in the embodiment of the present invention, the effect intended by the present invention can also be obtained by other combination, if only the material is transparent to the emission wavelength.

Although Mg was used as the dopant in the embodiment of the present invention, Zn may be used instead.

Although a single layer film was used as the active layer in the embodiment of the present invention, a multiple quantum well (MQW) may be used instead.

Although the surface electrode was circular in the embodiment of the present invention, this may be a different shape such as a square, a lozenge, a polygon, or the like.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting element, comprising:
a first conductive-type cladding layer, an undoped active layer, a second conductive-type cladding layer, and a second conductive-type current spreading layer that are formed on a first conductive-type semiconductor substrate,
wherein the second conductive-type cladding layer comprises a first dopant suppressing layer formed at a portion in the second conductive-type cladding layer, the portion being not in contact with the active layer, and
the first dopant suppressing layer comprises a dopant concentration lower than a region in the vicinity of the first dopant suppressing layer.

2. The semiconductor light emitting element according to claim 1, wherein:
the first dopant suppressing layer is not in contact with a layer formed on the second conductive-type cladding layer.

3. The semiconductor light emitting element according to claim 1, wherein:
the first dopant suppressing layer is formed 200 nm or more distant from the active layer.

4. The semiconductor light emitting element according to claim 1, wherein:
the first dopant suppressing layer is formed at two or more portions in the second conductive-type cladding layer.

5. The semiconductor light emitting element according to claim 1, wherein:
the first dopant suppressing layer is undoped.

6. The semiconductor light emitting element according to claim 5, wherein:
the first dopant suppressing layer has a thickness of 50 nm to 300 nm.

7. The semiconductor light emitting element according to claim 1, wherein:
the first dopant suppressing layer comprises a III-V group semiconductor crystal that is in lattice match with the second conductive-type cladding layer except the first dopant suppressing layer.

8. The semiconductor light emitting element according to claim 7, wherein:
the first dopant suppressing layer is transparent to light emitted from a light-emitting layer that comprises the second conductive-type cladding layer, the active layer, and the first conductive-type cladding layer.

9. The semiconductor light emitting element according to claim 7, wherein:
the first dopant suppressing layer is provided with a multilayer structure comprising a plurality of layers.

10. The semiconductor light emitting element according to claim 7, wherein:
the plurality of the first dopant suppressing layers have a thickness of 20 nm to 200 nm.

11. The semiconductor light emitting element according to claim 7, wherein:
the plurality of the first dopant suppressing layers each have a thickness of 2 nm to 30 nm.

12. The semiconductor light emitting element according to claim 1, further comprising:
an insertion layer formed between the second conductive-type cladding layer and the current spreading layer,
wherein the insertion layer has a bandgap energy between the second conductive-type cladding layer and the current spreading layer.

13. The semiconductor light emitting element according to claim 12, wherein:
the insertion layer comprises $Ga_X In_{1-X} P$, where X satisfies $0.6 \leq X \leq 1$.

14. The semiconductor light emitting element according to claim 1, further comprising:
a light reflecting layer formed between the first conductive-type semiconductor substrate and the first conductive-type cladding layer.

15. The semiconductor light emitting element according to claim 14, wherein:
the light reflecting layer comprises a combination of $(Al_X Ga_{1-X})_Y In_{1-Y} P$, where X and Y satisfy $0 \leq X \leq 1$ and $0.4 \leq Y \leq 0.6$, respectively, and $Al_X Ga_{1-X} As$, where X satisfies $0 \leq X \leq 1$.

16. The semiconductor light emitting element according to claim 1, wherein:
the first conductive-type cladding layer comprises a second dopant suppressing layer formed at a portion in the first conductive-type cladding layer, the portion being not in contact with the active layer, and
the second dopant suppressing layer comprises a dopant concentration lower than a region in the vicinity of the second dopant suppressing layer.

17. The semiconductor light emitting element according to claim 16, wherein:
the second dopant suppressing layer is not in contact with a layer formed under the first conductive-type cladding layer.

18. The semiconductor light emitting element according to claim 16, wherein:
the second dopant suppressing layer is undoped.

19. The semiconductor light emitting element according to claim 16, wherein:
the second dopant suppressing layer comprises a III-V group semiconductor crystal that is in lattice match with the first conductive-type cladding layer except the second dopant suppressing layer.

20. The semiconductor light emitting element according to claim 1, wherein:
the active layer comprises $(Al_X Ga_{1-X})_Y In_{1-Y} P$, where X and Y satisfy $0 \leq X \leq 1$ and $0.4 \leq Y \leq 0.6$, respectively.

21. The semiconductor light emitting element according to claim 1, wherein:
the active layer has a multiple quantum well structure.

22. The semiconductor light emitting element according to claim 1, wherein:
the second conductive-type cladding layer is doped with Mg or Zn, and the second conductive-type cladding layer and the first conductive-type cladding layer each comprise $(Al_X Ga_{1-X})_Y In_{1-Y} P$, where X and Y satisfy $0 \leq x \leq 1$ and $0.4 \leq Y \leq 0.6$, respectively.

23. The semiconductor light emitting element according to claim 1, further comprising:
an n-type semiconductor layer formed on the semiconductor substrate, wherein the n-type semiconductor layer comprises the same material as the semiconductor substrate.

24. The semiconductor light emitting element according to claim 1, wherein:
the current spreading layer comprises $Ga_xIn_{1-x}P$, where X satisfies $0.8 \leqq X \leqq 1$.

* * * * *